US012373130B2

(12) United States Patent
Galbraith et al.

(10) Patent No.: US 12,373,130 B2
(45) Date of Patent: Jul. 29, 2025

(54) GLOBAL VARIANCE PARAMETER BASED ON MUTUAL INFORMATION IN A DATA CHANNEL

(71) Applicant: Western Digital Technologies, Inc., San Jose, CA (US)

(72) Inventors: Richard Galbraith, Rochester, MN (US); Iouri Oboukhov, Rochester, MN (US); Jonas Goode, Lake Forest, CA (US); Niranjay Ravindran, Rochester, MN (US); Pradhan Bellam, Rochester, MN (US); Henry Yip, Bellflower, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 18/355,122

(22) Filed: Jul. 19, 2023

(65) Prior Publication Data
US 2024/0264765 A1    Aug. 8, 2024

Related U.S. Application Data

(60) Provisional application No. 63/482,919, filed on Feb. 2, 2023.

(51) Int. Cl.
*G06F 3/06* (2006.01)
*H03M 13/37* (2006.01)

(52) U.S. Cl.
CPC .......... *G06F 3/0655* (2013.01); *G06F 3/0604* (2013.01); *G06F 3/0673* (2013.01); *H03M 13/3784* (2013.01)

(58) Field of Classification Search
CPC .... G06F 3/0655; G06F 3/0604; G06F 3/0673; H03M 13/3784
(Continued)

(56) References Cited

U.S. PATENT DOCUMENTS 5,361,327 A    11/1994  Takahashi
5,488,617 A    1/1996   Van Driel
(Continued)

OTHER PUBLICATIONS

Chesnutt, "Novel Turbo Equalization Methods for the Magnetic Recording Channel," Doctor of Philosophy in Electrical and Computer Engineering dissertation, Georgia Institute of Technology, available online at https://smartech.gatech.edu/bitstream/handle/1853/6867/chesnutt_elizabeth_200505_phd.pdf, May 2005, 116 pgs.
(Continued)

*Primary Examiner* — James C Kerveros
(74) *Attorney, Agent, or Firm* — Patent Law Works LLP

(57) ABSTRACT

Example systems, read channel circuits, data storage devices, and methods to use a global variance parameter based on mutual information to modify operation of a soft output detector in a read channel are described. The read channel circuit includes a soft output detector, such as a soft output Viterbi algorithm (SOVA) detector that includes variance terms. The variance terms are modified by a global variance parameter based on mutual information values. The soft output detector processes an input signal using the modified branch variance terms to determine data bits and corresponding soft information for decoding data in the read channel.

20 Claims, 6 Drawing Sheets

(58) Field of Classification Search
USPC .......................................................... 714/780
See application file for complete search history.

(56) References Cited

U.S. PATENT DOCUMENTS

| | | | |
|---|---|---|---|
| 6,654,924 | B1 | 11/2003 | Hassner |
| 7,424,077 | B2 | 9/2008 | Yang |
| 8,291,304 | B2 | 10/2012 | Yoshida |
| 8,296,637 | B1* | 10/2012 | Varnica ............. H03M 13/2957 714/794 |
| 8,743,493 | B1 | 6/2014 | Chang |
| 8,760,780 | B1 | 6/2014 | Brooker |
| 8,786,968 | B2 | 7/2014 | Qin |
| 8,886,991 | B2 | 11/2014 | Zhang |
| 9,525,436 | B2 | 12/2016 | Tan |
| 9,875,770 | B1 | 1/2018 | Singleton |
| 11,438,014 | B2 | 9/2022 | Belzer |
| 2003/0041298 | A1 | 2/2003 | Bruner |
| 2008/0104460 | A1 | 5/2008 | Kanaoka |
| 2008/0168315 | A1 | 7/2008 | Mead |
| 2009/0094499 | A1* | 4/2009 | Deoka .................... G11B 20/18 714/752 |
| 2009/0150748 | A1 | 6/2009 | Egner |
| 2009/0158125 | A1* | 6/2009 | Harada ............. G11B 20/1833 714/763 |
| 2010/0185906 | A1 | 7/2010 | Rauschmayer |
| 2011/0085628 | A1 | 4/2011 | Kaynak |
| 2014/0112076 | A1 | 4/2014 | Ish-Shalom |
| 2014/0115381 | A1 | 4/2014 | Chang |
| 2014/0359394 | A1* | 12/2014 | Gasanov ........... H03M 13/6325 714/792 |
| 2015/0100855 | A1 | 4/2015 | Cai |
| 2015/0149873 | A1* | 5/2015 | Cai ....................... G11C 11/161 714/773 |
| 2015/0236717 | A1* | 8/2015 | El-Khamy .......... G06F 11/1004 714/807 |
| 2015/0372785 | A1 | 12/2015 | Raphaël |
| 2016/0293205 | A1 | 10/2016 | Jury |
| 2016/0321138 | A1 | 11/2016 | Nakamura |
| 2018/0358988 | A1 | 12/2018 | Sharon |
| 2019/0204088 | A1 | 7/2019 | Haque |
| 2019/0385094 | A1 | 12/2019 | Alex |
| 2020/0099401 | A1 | 3/2020 | Qin |
| 2020/0142642 | A1 | 5/2020 | Billa |
| 2020/0389188 | A1* | 12/2020 | Belzer ............... H03M 13/2957 |
| 2021/0135783 | A1 | 5/2021 | Yang |

OTHER PUBLICATIONS

Sayyafan et al., "Deep Neural Network Based Medial Noise Predictors for Use in High-Density Magnetic Recording Turbo-Detectors," IEEE Transactions on Magnetics, vol. 55, No. 12, available online at https://ieeexplore.ieee.org/document/8903447, Dec. 2019, 6 pages.

Moon et al., "Pattern-dependent noise prediction in signal-dependent noise. Selected Areas in Communications", IEEE Journal on Selected Areas in Communications. vol. 19, pp. 730-743, May 1, 2001.

Ryan et al., "Optimal Code Rates for the Lorentzian Channel: Shannon Codes and LDPC Codes." IEEE Transactions on Magnetics, Nov. 2004, vol. 40, No. 6, pp. 3559-3565.

Shen et al., "Deep Neural Network a Posteriori Probability Detector for Two-dimensional Magnetic Recording," available online at https://par.nsf.gov/servlets/purl/10198635, Oct. 21, 2019, 12 pgs.

Shen et al., "TDMR Detection System with Local Area Influence Probabilistic a Priori Detector," available online at https://arxiv.org/pdf/1904.06599.pdf, Apr. 13, 2019, 7 pgs.

Shi et al., "Adaptive Minimum-Bit-Error Rate PDNP Detection for Magnetic Recording," ICC 2020—2020 IEEE International Conference on Communications (ICC), Jun. 2020, pp. 1-6.

Wu et al., "Channel Modeling, Signal Processing and Coding for Perpendicular Magnetic Recording", ProQuest Dissertations and Theses, 2009, vol. 69-12, Sec. B, pp. 7723-7860.

J. Wang, T. Courtade, H. Shankar and R. D. Wesel, "Soft Information for LDPC Decoding in Flash: Mutual-Information Optimized Quantization," 2011 IEEE Global Telecommunications Conference - GLOBECOM 2011, Houston, TX, USA, pp. 1-6. 2011. (Year: 2011).

Ebada et al., "Scattered EXIT Charts for Finite Length LDPC Code Design," Institute of Telecommunications, 2018, pp. 1-7,.

Wang et al., "Mutual-Information Optimized Quantization for LDPC Decoding of Accurately Modeled Flash Data," 2012.

Li et al., "A Class of High-Rate, Low-Complexity, Well-Structured LDPC Codes from Combinatorial Designs and their Applications on ISI Channels," Electrical Engineering Dept, Texas A&M University, p. 1-8.

Khittiwitchayakul et al., "Associated Sectors of Magnetic Recording Systems Using Spatially Coupled LDPC Codes," ECTI Transactions On Electrical Engineering, Electronics, And Communications vol. 20, No. 1, 2022.

Wadayama et al. "Evaluation of Symmetric Mutual Information of the Simplified TDMR Channel Model", IEEEE, p. 1-6, 2015.

\* cited by examiner

GLOBAL VARIANCE PARAMETER BASED ON MUTUAL INFORMATION IN A DATA CHANNEL

TECHNICAL FIELD

The present disclosure relates to data channels for data storage devices, such as hard disk drives. In particular, the present disclosure relates to scaling of variance terms impacting operation of a soft output detector within the read channel.

BACKGROUND

In present-day data transmission and storage mediums, such as disk, tape, optical, mechanical, and solid-state storage drives, data detection is based in large part on techniques developed in the early years of the data storage industry. While recently developed read channels invoke relatively new data encoding and detection schemes such as iterative detection and low-density parity codes (LDPC), much of the signal processing power in today's read channels is still based on partial-response maximum-likely-hood detection (PRML), developed in the early 1990's. Iterative LDPC code detectors use successive iterations and calculated reliability values to arrive at the most likely value for each bit. Soft information may be calculated for each bit and is sometimes represented by a log likelihood ratio (LLR) value, which is the natural logarithm of the ratio of the probability that the bit is a 1 divided by the probability that the bit is a 0. In some configurations a soft output Viterbi algorithm (SOVA) detector that determines LLR values for each bit may be paired with an iterative decoder for determining bias values for the next iteration of the SOVA. For example, a SOVA detector may be paired with an LDPC decoder that receives bit LLR values, returns extrinsic LLR values, and outputs hard decisions when LDPC constraints are met.

SOVA detectors may include algorithms for pattern-dependent noise prediction (PDNP) and involve many parameters. For example, each SOVA branch may include noise whitening coefficients in order to produce a noise whitened signal and include a variance term to scale the squared error such that each branch has a normalized noise power. Noise whitening coefficients and variance terms can be determined by standard mathematical approaches and may be tuned to assist in channel optimization to get desired performance based on the heads, media, and other operating characteristics of a particular data storage device. For example, parameters of the SOVA detector may be optimized for each disk, head, and zone of a hard disk drive during the manufacturing process.

Increasingly, data channels are incorporating machine learning, such as artificial neural networks, to assist in data detection by replacing traditional signal processing and data detection components with trained neural networks performing similar functions. These neural networks may be used to set operating parameters for the data channel, preprocess symbol states, and/or carry out data detection and/or decoding. Like other parameters in the data channel, neural networks may be trained during the manufacturing process and may be retrained to adapt over the life and operation of the data storage device. Also, like other parameters, they may be optimized to support target data channel performance characteristics and may incorporate a variance factor for their respective cost functions.

Historically, many optimization techniques have focused on achieving a desired bit error rate (BER), even though BER does not always correlate to optimal performance, because it is less intensive to compute. Codeword failure rate (CFR) may be a more accurate metric for data channel optimization, but is very intensive to compute and is dependent on the data pattern being a valid codeword.

There is a need for technology that globally modifies the variance terms of parameters influencing the SOVA detector to improve optimization of the data channel.

SUMMARY

Various aspects for using a global variance parameter optimized to mutual information in a read channel are disclosed, particularly use of a global variance parameter for scaling the cost functions in the SOVA that is adapted to optimize mutual information.

One general aspect includes a read channel circuit that includes a soft output detector including a plurality of variance terms and configured to: receive an input signal; modify the plurality of variance terms using a global variance parameter; process, using the modified variance terms, the input signal to determine data bits and corresponding soft information; and output the data bits and corresponding soft information.

Implementations may include one or more of the following features. The global variance parameter may be configured to scale a cost vector that includes a cost value for each branch of a trellis of the soft output detector for pattern-dependent noise prediction. The soft output detector may be further configured to scale the cost vector for branch costs using the global variance parameter prior to processing the input signal through the trellis. The soft output detector may be further configured to scale the cost vector for sequence costs responsive to processing the input signal through the trellis. The read channel circuit may include a neural network circuit configured to: process the input signal prior to the soft output detector; and output at least one value to modify operation of the soft output detector, where the neural network circuit includes a variance term modified using the global variance parameter. The read channel circuit may include a global variance calculator circuit configured to determine the global variance parameter based on mutual information values. The read channel circuit may include a mutual information calculator circuit configured to: receive a known data pattern for at least one data symbol in the input signal; receive a corresponding cost vector from a cost generator circuit for the soft output detector for the known data pattern; calculate a symbol mutual information value based on the known data pattern and corresponding cost vector; and average symbol mutual information values for a plurality of data symbols in the input signal across a codeword to determine the mutual information values. The read channel circuit may include a gradient adapter circuit configured to: receive a target mutual information value; receive a current global variance parameter; receive current mutual information values based on the current global variance parameter; and iteratively adapt the global variance parameter to move the mutual information values closer to the target mutual information value. Iteratively adapting the global variance parameter may be based on at least one of: a sweeping algorithm for the global variance parameter; or a gradient adaptation algorithm based on a derivative of mutual information values to global variance parameters. Iteratively adapting the global variance parameter may not be responsive to calculating bit error rate. A data storage device may include the read channel circuit.

Another general aspect includes a method that includes: receiving, by a soft output detector, an input signal; modifying, using a global variance parameter, a plurality of variance terms in a soft output detector; processing, by the soft output detector and using the modified variance terms, the input signal to determine data bits and corresponding soft information; and outputting, by the soft output detector, the data bits and corresponding soft information.

Implementations may include one or more of the following features. The method may include scaling, using the global variance parameter, a cost vector may include a cost value for each branch of a trellis of the soft output detector for pattern-dependent noise prediction. Scaling the cost vector may be executed for branch costs prior to processing the input signal through the trellis. Scaling the cost vector may be executed for sequence costs responsive to processing the input signal through the trellis. The method may include processing, by a neural network, the input signal prior to the soft output detector; and outputting, by the neural network, at least one value to modify operation of the soft output detector, where the neural network may include a variance term modified using the global variance parameter. The method may include determining the global variance parameter based on mutual information values. The method may include: receiving a known data pattern for at least one data symbol in the input signal; receiving a corresponding cost vector from a cost generator for the soft output detector for the known data pattern; calculating a symbol mutual information value based on the known data pattern and corresponding cost vector; and averaging symbol mutual information values for a plurality of data symbols in the input signal across a codeword to determine the mutual information values. The method may include: determine a target mutual information value; receiving a current global variance parameter; receiving current mutual information values based on the current global variance parameter; and iteratively adapting the global variance parameter to move the mutual information values closer to the target mutual information value. Iteratively adapting the global variance parameter may be based on at least one of: a sweeping algorithm for the global variance parameter; or a gradient adaptation algorithm based on a derivative of mutual information values to global variance parameters. Iteratively adapting the global variance parameter may not be responsive to calculating bit error rate.

Still another general aspect includes means, including a plurality of branch variance terms, for: receiving an input signal; modifying a plurality of variance terms using a global variance parameter, where the global variance parameter is based on mutual information values; processing, using the modified variance terms, the input signal to determine data bits and corresponding soft information; and outputting the data bits and corresponding soft information. The system also includes means for: receiving a known data pattern for at least one data symbol in the input signal; receiving a corresponding cost vector from a cost generator circuit for the known data pattern; calculating a symbol mutual information value based on the known data pattern and corresponding cost vector; and averaging symbol mutual information values for a plurality of data symbols in the input signal across a codeword to determine the mutual information values.

The present disclosure describes various aspects of innovative technology capable of improving performance and reducing unnecessary margin in data storage devices. The various embodiments include operations and control circuitry to overcome or at least reduce issues previously encountered in data storage devices and, accordingly, are more reliable and/or may support higher areal densities than other data storage devices. That is, the various embodiments disclosed herein include hardware and/or software with functionality to improve read operation processing and read channel performance, such as by using a global variance circuit coupled to a soft output detector to determine a global variance value for cost function variances impacting the soft output detector. Accordingly, the embodiments disclosed herein provide various improvements to read channel circuits, data storage devices, and computing systems incorporating such read channels.

BRIEF DESCRIPTION OF THE DRAWINGS

The techniques introduced herein are illustrated by way of example, and not by way of limitation, in the figures of the accompanying drawings in which like reference numerals are used to refer to similar elements.

DETAILED DESCRIPTION

Novel data processing technology, such as but not limited to systems, data storage devices, read channels, and methods for detecting, decoding, and/or recovering previously encoded data in a data channel, such as a data storage read channel using a global variance parameter to modify the branch variance terms of a soft information detector (e.g., a soft output Viterbi algorithm (SOVA) detector), are disclosed. While this technology is described below in the context of a particular system architecture in various cases, it should be understood that the systems and methods can be applied to other architectures and organizations of hardware.

In some examples, the data channel technology may be applied to a data storage read channel for recovering encoded data from a non-volatile storage medium. For example, the read channel may be incorporated in a data storage device, such as a hard disk drive (HDD), a solid-state drive (SSD), a flash drive, an optical drive, a tape drive, etc. It is to be understood that the embodiments discussed herein may be applicable HDD and SSD, as well as a tape drive such as a tape embedded drive (TED) or an insertable tape media drive, such as those conforming to the LTO (Linear Tape Open) standards. An example TED is described in U.S. Pat. No. 10,991,390, issued Apr. 27, 2021, titled "Tape Embedded Drive," and assigned to the same assignee of this application, which is herein incorporated by reference. As such, any reference in the detailed description to an HDD or tape drive is merely for exemplification purposes and is not intended to limit the disclosure unless explicitly claimed. For example, references to disk media in an HDD embodiment are provided as examples only, and can be substituted with tape media in a tape drive embodiment. Furthermore, reference to or claims directed to magnetic recording devices or data storage devices are intended to include at least both HDD and tape drive unless HDD or tape drive devices are explicitly claimed.

Figure 1A:
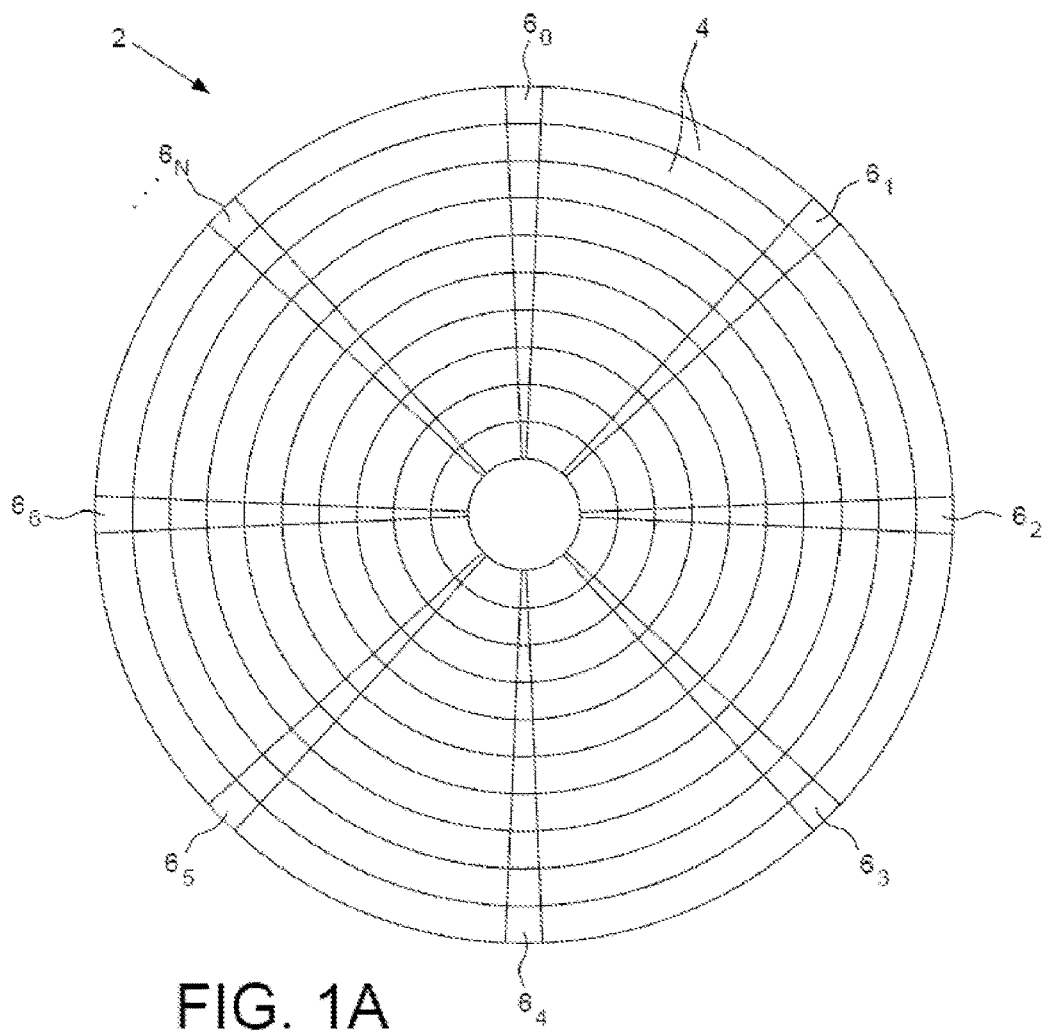
FIG. 1A is a block diagram of a prior art disk format comprising a plurality of servo tracks defined by servo sectors.
Figure 1B:
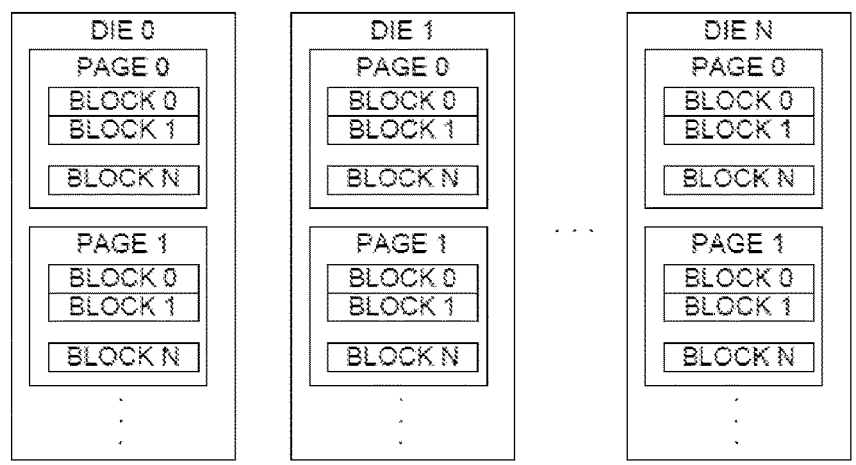
FIG. 1B is a block diagram of a prior art solid state drive format comprising a plurality of dies each comprising a plurality of pages.

FIG. 1A shows a prior art disk format 2 as comprising a number of servo tracks 4 defined by servo sectors $6_0$-$6_N$ recorded around the circumference of each servo track. Data tracks are defined relative to the servo tracks at the same or different radial density, wherein each data track comprises a plurality of data sectors. Each data sector may store the data symbols of a single codeword, or in other examples, each data sector may store symbols from multiple codewords (i.e., interleaved codewords). FIG. 1B shows a prior art die format for a solid state drive, wherein each die may store multiple pages and each page may store multiple blocks each corresponding to a data sector or other data unit of encoded binary data of a disk drive.

In data storage devices incorporating non-volatile storage media, such as the disk of FIG. 1A, the non-volatile memory devices of FIG. 1B, or magnetic tape in a TED or other tape drive such as LTO, an analog read signal from the storage media may be converted into a digital bit stream by an analog-to-digital-converter (ADC) and passed to the read channel for further processing. In some examples, bit data values may be stored to a non-volatile storage medium as data blocks or other data units using one or more encoding schemes. These bit data values may be processed from the digital bit stream in windows of multiple adjacent bits and a set of adjacent bits, such as 2, 3, 5, 7, or more continuous bits from the bit stream, may be processed as a symbol for data detection and/or decoding purposes. One or more symbols may, in turn, make up one or more codewords, such as codewords selected and encoded in accordance with an error detection and/or correction scheme, such as low-density parity check (LDPC) codes. These encoded codewords may be decoded to determine decoded bit values. In some examples, the decoded bit values from these codewords may still be subject to further decoding, such as run-length limited (RLL) decoding and/or descrambling to arrive that the output data. While the description below refers to non-volatile storage medium/media (NVSM) examples, the various examples disclosed could be applied to process data read from volatile medium/media as well, as well as data signals transmitted through and/or received from a wired, wireless, or other transmission medium.

Modern HDDs use pattern-dependent noise predictive (PDNP) soft output Viterbi algorithm (SOVA) detectors to detect bit patterns from an input signal, such as the read data signal from reading NVSM. In some configurations, the SOVA detector is based on a trellis that is iteratively evaluated to determine the likelihood of detected bits or symbols in order to output most likely data bits and associated soft information, such as log likelihood rations (LLR). SOVA detectors operate based on a large number of parameters that influence the operation of the SOVA detector and processing of an input signal through the trellis. For example, the SOVA detector may calculate branch metrics for each branch or path through the trellis and each branch may have associated parameters, such as noise whitening coefficients used to produce a noise whitened signal. An example noise whitened signal $y_k$, where k is a bit index and x is the input value, may be represented by $y_k = p_0 x_{k-0} + p_1 x_{k-1} + p_1 x_{k-2}$. Each SOVA branch may include a variance term to scale the squared error such that each branch has a normalized noise power. For example, the cost for a symbol Li, where i is the L element index, is:

$$L_i = \frac{(y - \hat{y}_i)^2}{2 \text{Var}_i}$$

There are known methods for determining noise whitening coefficients and the variance term for each branch by a standard mathematical approach. However, there has previously been no generalized parameter to optimize across multiple parameters, such as each branch cost for a corrected symbol.

Mutual information (MI) may provide a new metric for channel optimization. Mutual information is a specific computation in information theory. For each symbol of data stored and then retrieved, MI can have a value from $-\infty$ to +1. Positive values (0<=MI<=1) indicate that the symbol caries from no information (MI=0) up to the ideal true amount of information (MI=1). Negative values (MI<0) indicate that the symbol carries false information which can be very large. For example, MI=-10 would indicate that the symbol carries -10 symbols of false information (causing errors in other symbols). In HDD, large negative MI values may be referred to as hard bits.

Mutual Information is more closely correlated to iterative detector performance than is bit error rate (BER). BER is not always a good metric for determining iterative detector performance. Global variance is a simple single parameter that can often improve the average codeword mutual information and thus improve iterative decoder performance. An easy-to-use gradient dMI/dG can provide an adaptive loop with the correct adaptation gradient to maximize mutual information by adjusting one or more parameters of the iterative decoder and related signal processing. Global variance can also minimize the detrimental effect of hard bits.

In the detection process, a cost vector L can be generated where each element of the vector represents the cost incurred for representing the data as that element value. Costs may be thought of as the square error in a noise whitened signal scaled by a variance. The cost vector can be produced before the SOVA trellis to represent branch costs or produced after the SOVA trellis to represent sequence costs. MI is calculated from the L cost vector and knowledge of the correct data pattern and may be calculated for various symbol sizes. For example, various symbol sizes cab used, such as from 1 bit symbols (2-ary MI) to 5 bit symbols (32-ary MI) may by typical. MI may be represented by:

$$MI = \frac{1}{N} \sum_{1}^{N} 1 + \log_a \left( \frac{e^{L_c}}{\sum_{i=1}^{n} e^{-L_i}} \right)$$

Where, $L_c$ is the cost for correct symbol elements, N is the number of symbols, a is the a-ary number of elements in each symbol, k is the bit index, and i is the L element index.

Global variance, where the global variance parameter is labeled G, may provide a single parameter that scales all cost functions in the SOVA with a common variance scaling. For example, each variance term, such as branch variance terms for each branch of the SOVA trellis, may be scaled by G using:

$$L_i = \frac{(y - \hat{y}_i)^2}{G * 2 \, \text{Var}_i}$$

Global variance may be used to optimize mutual information in a way that other parameters may not. For example, global variance may have little to no effect on BER, which is often used as a performance metric for parameter tuning. Similarly, standard processes for determining per branch variance terms may also not fully optimize MI. Therefore, using a global variance parameter tuned using MI for feedback may result in a more effective read channel optimization than prior techniques.

Figure 2:
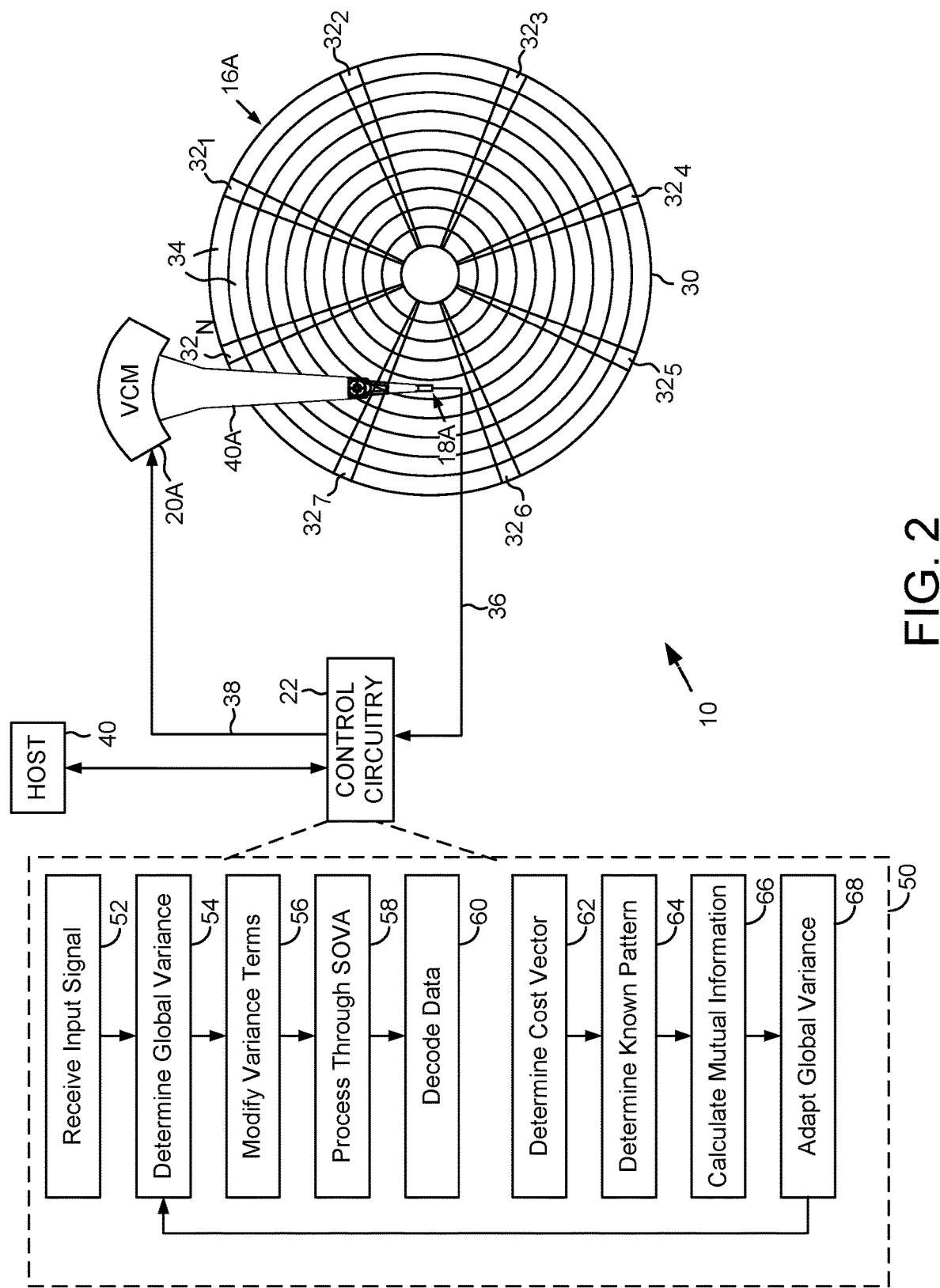
FIG. 2 is a diagram of an example data storage device in the form of a disk drive comprising a head actuated over a disk surface and related read channel control circuitry.

FIG. 2 shows a data storage device in the form of a disk drive according to an embodiment comprising a disk 30 having at least one disk surface 16A and at least one head 18A actuated over disk surface 16A by a first actuator 20A. While a single disk, head, and actuator are shown, multiple disks, heads, and/or actuators may be present in other configurations.

Disk drive 10 further comprises control circuitry 22 configured to execute flow diagram 50 for detecting bit and symbol data in read signals based on soft log likelihood ratios (LLR) or other soft information. For example, disk drive 10 may include on-board electronics comprising one or more systems on a chip (SOC), application-specific integrated circuits (ASICs), and/or other data or signal processing components attached to a printed circuit board assembly (PCBA) and/or other interconnects (such as the flex connector to the actuators). Control circuitry 22 may include circuits, processors, memory devices, and software or firmware executed therein for completing various data and signal processing tasks, including control of actuator 20A and read-write operations through head 18A. In some embodiments, control circuitry 22 may include distinct servo control and read/write channel paths for each actuator and their respective disk surfaces (and data written thereon).

In FIG. 2, each disk surface (e.g., 16A) comprises a plurality of servo sectors $32_1$-$32_N$ that define a plurality of servo tracks 34, wherein data tracks are defined relative to the servo tracks at the same or different radial density. Control circuitry 22 processes a read signal 36 emanating from the head to demodulate the servo sectors and generate a position error signal (PES) representing an error between the actual position of the head and a target position relative to a target track. A servo control system in control circuitry 22 filters the PES using a suitable compensation filter to generate a control signal 38 applied to a coarse actuator (e.g., voice coil motor (VCM) actuator 20A) which rotates an actuator arm (e.g., 40A) about a pivot in order to actuate the corresponding heads radially over the disk surfaces in a direction that reduces the PES. The heads may also be served using a fine actuator, such as a piezoelectric (PZT) actuator, configured to actuate a suspension relative to the actuator arm, and/or configured to actuate the head relative to the suspension. Servo sectors $32_1$-$32_N$ may comprise any suitable head position information, such as a track address for coarse positioning and servo bursts for fine positioning. The servo bursts may comprise any suitable pattern, such as an amplitude-based servo pattern or a phase-based servo pattern.

A host 40 is a computer system or other external system or device to which disk drive 10 is coupled and/or integrated. The storage medium (e.g., disk 30) is accessible for data storage and I/O (input/output) operations. For instance, host 40 may issue commands for data manipulation in the storage medium. Control circuitry 22 mediates the communication between host 40 and the storage medium and provides an interface between the storage medium and a bus connecting it to the rest of the system. For example, control circuitry 22 may be a drive or memory controller of a data storage device that receives host storage commands and returns responses, including host data written to and read from disk 30. Control circuitry 22 may include data write channel circuitry for data writing execution and data read channel circuitry for data reading execution.

When reading data from disk 30, control circuitry 22 may receive a command signal from host 40, which instructs control circuitry 22 to access a certain portion of disk 10 (e.g., the locations of blocks on disk surface 16A corresponding to a data unit) to be accessed. As a further example, in response to the command signal, servo electronics within the control circuitry 22 may produce control signals that position head 18A over a desired track (e.g., tracks 34) in disk drive 10, which develops read signal 36 indicative of flux reversals in the track over which head 18A is positioned. Control circuitry 22 may include a read channel configured to detect and decode host data from read signal 36. Control circuitry 22 may then manipulate and/or return the host data to host 40.

Control circuitry 22 may include hardware and firmware configured to execute an example method for using a global variance parameter, based on mutual information, to improve operation of a SOVA detector in the read channel, such as flow diagram 50. In some embodiments, control circuitry 22 may incorporate hardware and/or software elements similar to those shown and described for FIG. 3 below for executing flow diagram 50. For example, control circuitry 22 may incorporate a SOVA detector with a global variance calculator, mutual information calculator, and gradient adapter to set modify the variance terms of the SOVA detector. The resulting detected bits and soft information may improve the reliability and efficiency of the read channel for correctly detecting and decoding host data stored to disk 30.

At block 52, an input signal may be received. For example, read signal 36 may be processed through an analog front-end, including an analog-digital converter (ADC), and an equalizer to provide an input signal to a SOVA detector.

At block 54, a global variance parameter may be determined. For example, the SOVA detector may include a current global variance parameter value previously set by an adaptive calculation based on mutual information in blocks 62-66.

At block 56, the global variance parameter may modify a plurality of variance terms in the SOVA detector, such as branch variance terms for each branch through the SOVA trellis. For example, each set of branch parameters, such as noise whitening coefficients, may be normalized by a variance term for that specific branch, and each branch variance term may then be scaled by applying the global variance parameter.

At block 58, the input signal may be processed through the SOVA trellis to determine the most likely bit values and corresponding soft information for the input signal. For example, the symbol states for sequences of bit values in the input signal may be used to populate and process the trellis, along with extrinsic information from prior iterations of the SOVA detector and/or corresponding iterative decoder, to determine LLR values for the current iteration of bit detection and codeword decoding.

At block 60, the SOVA detector may operate iteratively and in conjunction with an iterative decoder, such as a low-density parity-check code (LDPC) decoder, to determine and correct all bits in a codeword and decode it. The iterative decoder may return the decoded data of the codeword for further processing in the read channel circuit and/or to storage device firmware for return host 40. For example, each pass through the SOVA detector may change the bit determinations and corresponding soft LLR values based on feedback of extrinsic information. In some configurations, global iterations may pass the bit information and soft information from the SOVA detector to the iterative decoder between iterations and may receive soft information from the LDPC decoder to further influence the next determination of bit values and LLR values until the LDPC decoder successfully decodes the codeword.

At block 62, a cost vector may be determined. For example, the SOVA detector may include a cost generator that determines a cost vector with cost values for each branch based on the input signal being processed.

At block 64, a known pattern (e.g., known values (1 or 0) for each data bit in a symbol/codeword) for the input data may be determined. For example, a training pattern of known values stored to the storage medium may be read or the results of a decoded codeword (e.g., from block 60) may be fed back as a known pattern for adapting the global variance parameter.

At block 66, mutual information may be calculated. For example, the cost vectors and known patterns for each symbol may be calculated as symbol mutual information values and then averaged across the codeword for an average mutual information value.

At block 68, the global variance parameter may be adapted based on the mutual information values. For example, the global variance parameter may be varied across multiple iterations and/or codewords to achieve a target mutual information that improves operation of the read channel. In some configurations, the adapted global variance parameter from block 68 is fed back to block 54 for each iteration during adaptation and then may be fixed as the current global variance for an operating period until a next adaptation period.

Figure 3:
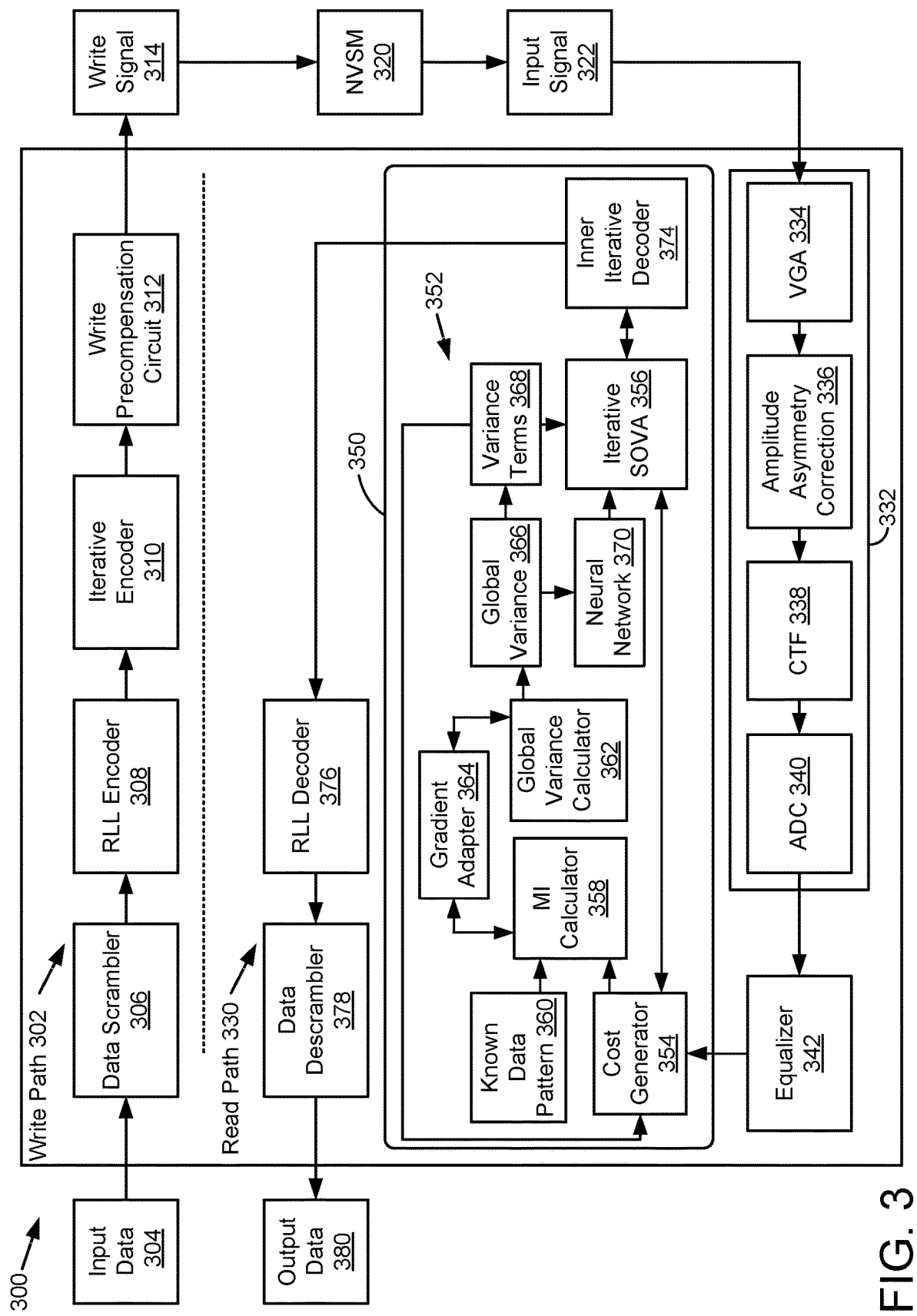
FIG. 3 is a block diagram of an example data storage system including various data processing components.

FIG. 3 is a block diagram illustrating control circuitry 300 comprising components employed in a read/write path of a storage system, such as the read/write channel of a data storage device. As illustrated, the write path 302 includes a data scrambler 306, an RLL encoder 308, an iterative encoder 310, and a write precompensation circuit 312. A write signal 314 may be output by the write path in some examples to store the resulting write bit stream to NVSM 320. Similarly, an input signal 322 may be read from NVSM 320 for processing through a read path 330. Read path 330 includes a variable gain amplifier (VGA) 334, an amplitude asymmetry correction (AAC) component 336, a continuous time filter (CTF) 338, an ADC 340, an equalizer 342, an iterative decoder 350, a RLL decoder 376, and a data descrambler 378. These component(s) receive input signals 322 as an analog read signal, and process, decode, and output the signals as output data 380, which may include decoded binary data units, such as data blocks. In some examples, these component(s) of read path 330 may comprise a read channel device or circuit. In some configurations, blocks may correspond to specific hardware circuits and/or software components and/or may be supported by one or more processors and memories configured to execute software instructions for completing the described functions or operations.

Data scrambler 306 "randomizes" input data 304 ("whitens" the input sequence of the data) to be written into a storage media. In general, a storage system has no control over the data the user is going to write. This causes problems because it violates the assumptions that are usually made when designing storage systems, such as having independent data symbols. Since the data are not random, a frequently occurring problem is long strings of zeros in the data, which can cause difficulties in later timing recovery and adaptive equalization. These problematic sequences can be removed (or, actually, made much less likely) by introducing randomization of the input sequence for the input data 304. Therefore, during the data writing process, input data 304 may be first randomized by data scrambler 306.

RLL encoder 308 modulates the length of stretches in the randomized data. RLL encoder 308 employs a line coding technique that processes arbitrary data with bandwidth limits. Specifically, RLL encoder 308 can bound the length of stretches of repeated bits so that the stretches are not too long or too short. By modulating the data, RLL encoder 308 can reduce the timing uncertainty in later decoding of the stored data, which could lead to the possible erroneous insertion of bits when reading the data back, and thus ensure the boundaries between bits can more reliably be found.

Iterative encoder 310 can append one or more parity bits to the modulated block code for later detection whether certain errors occur during data reading process. For instance, an additional binary bit (a parity bit) may be added to a string of binary bits that are moved together to ensure that the total number of "1"s in the string is even or odd. The parity bits may thus exist in two different types, an even parity in which a parity bit value is set to make the total number of "1"s in the string of bits (including the parity bit) to be an even number, and an odd parity in which a parity bit is set to make the total number of "1"s in the string of bits (including the parity bit) to be an odd number. In some examples, iterative encoder 310 may implement a linear error correcting code, such as LDPC codes or other turbo codes, to generate codewords that may be written to and more reliably recovered from NVSM 320. In some examples, iterative encoder 310 may further implement one or more single parity check codes within the codeword for recovery using soft information decoding, such as SOVA, Bahl, Cocke, Jelinek, Raviv (BCJR), or other single parity check code decoding techniques. Iterative encoder 310 may implement iterative encoding techniques to reuse the decoder architecture (components of iterative decoder 350), thereby reducing circuit space.

Write precompensation circuit 312 can alleviate the effect of nonlinearities in the writing process. Major causes of the nonlinearities during data writing include bandwidth limitations in the write path and the demagnetizing fields in the magnetic medium for magnetic disks. These nonlinearities can cause data pattern-dependent displacements of recorded transitions relative to their nominal positions. The write precompensation circuit 312 can compensate for these data pattern-dependent displacements by introducing data pattern-dependent compensating shifts into the signals. After compensation, the information may then be written as non-return to zero (NRZ) data.

In an HDD embodiment, when reading data back from the NVSM 320, the data head of the disk drive senses the transitions (changes) in the storage medium and converts the information back into an electronic waveform. Reading analog input signal 322 from a storage medium starts at the storage medium (e.g., the drive's storage platter) and head transducer (see FIG. 2). The head transducer is located prior to the analog front-end circuit 332 in the data read path and the head transducer output is driven by the data pattern previously written on the rotating disk. After converting into an electronic waveform, the head transducer output (e.g., input signal 322) may be further processed by the components illustrated in FIG. 3 in the read path 330 for data detection, decoding, and descrambling.

VGA 334 amplifies the analog signal read back from the storage medium. VGA 334 controls a signal level of the read-back analog signal based on a gain determined by an automatic gain control loop. One main function of the automatic gain control loop is to control an input signal level for optimum performance in the ADC 340. Too much gain from VGA 334 can cause sample values in ADC 340 to rail at maximum or minimum ADC levels, while too little gain can cause quantization noise to dominate the signal-to-noise ratio (SNR) and thus adversely affect bit error rate performance.

AAC 336 and CTF 338 work to linearize the amplified analog signal prior to feeding it to ADC 340. In an HDD embodiment, AAC 336 works to reconstruct linearity that may have been lost in the head transducer stage when the information on the storage disk is converted into an electronic signal at the output of the data head. The biasing of the head signal may in some cases be adjusted to keep the signal in the linear range of the head sensitivity curve. However, if the signal amplitude changes due to fly height or disk variation exceed the head transducer linear range, saturation in the peak or trough of the electrical head signal can occur. AAC 336 may use signal offset to determine the amount of squared signal to add back to restore the positive and negative symmetry of the signal.

It should be noted that in practice, the read back analog signals from many different commonly used heads in existing devices cannot be linearized, regardless of the kind of biasing approach that is employed. Thus, improving data detection and recovery technology in the read channel can advantageously handle the read back signals from these types of heads because it may better compensate for non-linear responses from the read heads.

CTF 338 provides mid-band peaking to help attenuate high-frequency noise and minimize any aliasing that may occur when the analog signal is converted to a sampled representation. In an HDD embodiment, aliasing may not have a large effect on a drive surface's bit error rate performance. However, it can have an impact on disk drive manufacturing yields. CTF 338 is typically a multiple pole low pass filter (e.g., a four pole Butterworth filter) with a zero available for mid-band peaking. Signal peaking can be used to emphasize frequency components, which are useful in shaping the signal to meet the digital target signal characteristic. Besides anti-aliasing, CTF 338 may also partially equalize the data.

ADC 340 can convert an analog signal (e.g., input signal 322), as input and/or processed by upstream components, to digital samples quantized in time and amplitude. The clock used may include the output of a digital phase-locked loop, which tracks the channel rate clock frequency. The output of ADC 340 may be used as feedback to control the timing of the digital phase-locked loop as well as the automatic gain control, DC baseline correction, and equalization. VGA 334, CTF 338, and ADC 340, with or without AAC 336, together may be called an analog front-end 332, as the signals processed in these components are analog, while the signals in the remaining downstream components of read path 330 may be digital, although other variations of analog front-end 332 (which may be considered as one example form of an analog to digital convertor) may comprise software and/or hardware elements configured to convert signals from analog to digital and/or include other components for filtering, tuning, and/or processing data. In an HDD embodiment, the read channel analog front-end functions are generally similar regardless of whether the data is recorded using perpendicular or horizontal techniques.

Equalizer 342 is used for compensating for channel distortion. For example, an FIR filter may perform filtering to provide additional equalization of the signal to match signal characteristic to the desired target response for bit detection. Some equalizers may also include a noise whitening filter that further equalizes the spectrum of the signal from the FIR samples to remove noise that has a non-flat amplitude spectrum. For example, the noise whitening filter may enhance low-level spectral components and attenuate high-level ones. At the output of equalizer 342, the signal is now in a fully digital form and ready for detection of the encoded bits. The digital sample stream is submitted as an input signal to the sequence detector (e.g., iterative decoder 350) to begin decoding in trellises for bit recovery.

Iterative decoder 350 may include an iterative inner decoder 374 and one or more SOVA detectors (sometimes considered a SOVA detector with multiple stages), such as iterative SOVA 356. In the example shown, iterative SOVA 356 may include one or more trellises and associated processing for an input data signal and may be a part of a soft output detector 352 configured to use a global variance parameter based on mutual information. Soft output detector 352 may output detected bits (sampled in bits, symbols, or codewords) and corresponding soft information, such as soft LLR values, for each detected bit. Soft output detector 352 may output the bit detection data and corresponding soft information to a next stage or iteration of the SOVA detector and/or inner iterative decoder 374.

In the configuration shown, soft output detector 352 includes a cost generator 354, such as a cost generator circuit, configured to calculate a cost vector of branch cost values prior to processing through the SOVA trellis of iterative SOVA 356. For example, cost generator 354 may use the input data (from equalizer 342) to calculate a cost value for each branch based on a squared error of the signal and a branch-specific variance term. In some configurations, cost generator 354 may be configured to operate on the input signal before or after processing by iterative SOVA 356. For example, a cost vector generated before trellis processing may be a branch cost and a cost vector generated after trellis processing may be a sequence cost. In either case, the costs in the cost vectors may represent branch-specific parameters related to the data detection performance of iterative SOVA 356 that impact the bit and soft information passed through SOVA and/or global iterations. As described above, the cost of each element may include a branch-specific variance term that is modified (e.g., scaled or multiplied) by a global variance parameter that may be determined dynamically over the life of the read channel as further described with regard to blocks 358-368.

Iterative SOVA 356 may use a Viterbi-like algorithm to decode a bit stream for bit recovery. Iterative SOVA 356 may include a variant of the classical Viterbi algorithm. It may differ from the classical Viterbi algorithm in that it uses a modified path metric which takes into account a priori probabilities of the input symbols, and produces a soft output indicating the reliability of the decision. Iterative SOVA 356 operates by constructing a trellis of the state of probabilities and branch metrics. In some examples, iterative SOVA 356 may be configured to detect the probabilities of bit values based on single parity check codes. Once the bit recovery is completed, parity post-processing can be performed. In some examples, an initial set of bit probabilities may be provided to inner iterative decoder 374 for parity-based decoding of the codeword, initiating iterative bit detection by iterative SOVA 356 and parity determination by inner iterative decoder 374 with the two components exchanging sets of bit probabilities as extrinsic information for reaching their maximum likelihood results and returning a decoding decision. Each time soft information is passed from iterative SOVA 356 to inner iterative decoder 374 and back to iterative SOVA 356 may be considered a global iteration of iterative decoder 350, since both Iterative SOVA 356 and inner iterative decoder 374 may also perform internal iterations where data is not passed between them.

In the example shown, a mutual information (MI) calculator 358, such as a mutual information calculator circuit, may be used to determine the global variance parameter. As discussed above, the global variance parameter may be used by cost generator 354 to determine the cost vectors, so the cost vectors used by MI calculator 358 may reflect a current global variance parameter previously set by soft output detector 352 and adaptation of the global variance parameter may be an iterative process, as further described below. MI calculator 358 may receive the cost vector from cost generator 354 and a known data pattern 360 for the corresponding input data signal. For example, MI calculator 358 may calculate MI on a per symbol basis and may use the cost vectors and corresponding known data pattern to calculate a mutual information value for each symbol using the mutual information equation above. In some configurations, known data pattern 360 may be known based on a training or configuration data pattern previously written to NVSM 320. For example, NVSM 320 may store known data patterns in reserved areas for use in various training, configuration, and/or calibration activities, such as calibrating the global variance parameter, retraining neural networks, etc. In some configurations, known data pattern 360 may be based on feedback from soft output detector 352 and/or inner iterative decoder 374 to dynamically update the MI calculation throughout the operating life of the device. For example, after a successful decode operation, the bits of a codeword are known and the input signal values may be retained in a channel buffer to allow MI calculator 358 to calculate mutual information values for the symbols in that codeword. In some configurations, MI calculator 358 may be configured to average or otherwise aggregate mutual information values across a group of symbols to determine aggregate mutual information values. For example, MI calculator 358 may average the symbol mutual information values from a codeword into a codeword mutual information value. Similarly, mutual information values may be aggregated for larger blocks, sectors, tracks, or other aggregations of symbols or other data subunits. MI calculator 358 may be configured to output one or more calculated mutual information values as channel performance parameters for use by other components and/or users in monitoring, evaluating, and/or adjusting the performance of the read channel. For example, MI calculator 358 may output mutual information values to gradient adapter 364 for to use in adjusting the global variance parameter 366 calculated by global variance calculator 362.

Global variance calculator 362 may be configured to determine the global variance parameter 366 applied to variance terms 368 of soft output detector 352. For example, global variance calculator 362, such as a global variance calculator circuit, may iteratively determine global variance parameter values and use gradient adapter 364 to evaluate the global variance parameter value that achieves mutual information values at least meeting a mutual information target value, with a goal of maximizing mutual information (with the optimal value being 1). In some configurations, global variance calculator 362 may start from a default value, such as 1, a historical or population-based default value, or another seed value configured in read channel configuration parameters or provided by a user. For example, a global variance value of 1 may represent operation of the channel without the global variance parameter and the global variance parameter may be iteratively adapted to modify operation of the channel, such as values in a range of 1.0 to 3.0. Global variance calculator 362 may use one or more methods for modifying or adapting a current global variance parameter value until an optimal value is determined. In some configurations, global variance calculator 362 may use a sweeping or scanning algorithm to try different values until a "best" value is determined. For example, a sweeping algorithm may use a value range, increment, and sweep or scan algorithm for selecting the next value in the range to attempt and may include logic for determining when all reasonable values have been evaluated. In some configurations, mutual information is used as the feedback value for determining whether the best global variance parameter 366 has been selected for the read channel based on a set of input data (e.g., input read signal and corresponding known data pattern). Mutual information values may be provided by mutual information calculator 358.

In the example shown, a gradient adapter 364, such as a gradient adapter circuit, is provided to more efficiently determine global variance parameter 366 based on mathematical and/or graphical relationships between mutual information values and global variance parameter values. For example, gradient adapter 364 may be configured to use a derivative gradient dMI/dG for adaptation. Calculating the derivative of MI with respect to global variance may allow a gradient adaptation method to converge to an optimal global variance to achieve a target MI, such as maximum MI. Note that while MI=1 may be the ideal MI, that is generally not possible and target MI values or thresholds may be more commonly set between 0.8-0.9. In some configurations, the derivative dMI/dG may be based on the symbol size being used. For example, for a binary symbol:

$$MI = 1 - \log_2\left(1 + e^{-(L_n - L_c)/G}\right)$$

$$\frac{dMI}{dG} = \frac{-(L_n - L_c)}{\ln(2)\left(1 + e^{(L_n - L_c)}\right)}$$

where $L_c$=cost for correct symbol element, $L_n$=cost for incorrect symbol element, and G=global variance. In some contexts, cost difference $L_n - L_c$ may be referred to as SOVA margin and its relationship to mutual information may be beneficial for determining global variance and other read channel parameters. Gradient adapter 364 may return a next global variance parameter value or a modifier value from the current global variance parameter to global variance calculator 362 for calculating global variance parameter 366. In some configurations, determining a 0 value of the derivative may identify a local maximum for a next global variance parameter value. A gradient adaptation algorithm may be applied to the derivative to determine the next global variance parameter value for adapting global variance parameter 366.

In some configurations, global variance parameter 366 is used by soft output detector 352 to modify the variance terms 368 used by iterative SOVA 356. For example, global variance parameter 366 may be used to scale the branch variance terms for each branch of iterative SOVA 356. In some configurations, global variance parameter 366 may also be used to scale the cost functions of one or more neural network circuits 370 in iterative decoder 350 and/or the signal processing between ADC 340 and iterative decoder 350. For example, the read channel may include one or more neural networks trained to process the input data signal and/or generate parameters from the input data signal. These adaptive processes (such as filtering) and parameters (such as filter coefficients) may change the operating parameters of iterative SOVA 356 and/or the signals received by iterative SOVA 356. Neural network circuits 370 may have a neural network topology, including number and configuration of nodes and layers, as well as various node and path functions. Neural network circuits 370 may be trained during configuration or calibration, as well as adapting during the operations of the device. For example, similar to MI calculator 358, neural network circuits 370 may receive input data signals as training data use known data pattern 360 in a cost function to adapt the coefficients of the neural network. Neural network cost functions may include a variance term that may be scaled using global variance parameter 366. As a result, neural network circuits 370 may be tuned alongside the branch variance terms 368 using global variance to optimize mutual information.

Inner iterative decoder 374 may help to ensure that the states at the parity block boundary satisfy the parity constraint by conducting parity error checking to determine whether data has been lost or written over during data read/write processes. It may check the parity bits appended by iterative encoder 310 during the data writing process, and compare them with the bits recovered by the SOVA detector. Based on the settings of iterative encoder 310 in the data writing process, each string of recovered bits may be checked to see if the "1"s total to an even or odd number for the even parity or odd parity, respectively. A parity-based post processor may also be employed to correct a specified number of the most likely error events at the output of the Viterbi-like detectors by exploiting the parity information in the coming sequence. Iterative SOVA 356 and the inner iterative decoder 374 together may be referred to as an iterative decoder 350, as iterative decoding may exist between the two components. For example, iterative SOVA 356 may pass detected sets of bit probabilities (e.g., soft LLR) to inner iterative decoder 374 and inner iterative decoder 374 may use those bit probabilities to determine a most likely codeword match. If decode decision parameters are not met, inner iterative decoder 374 may feedback soft information for the set of bit probabilities to iterative SOVA 356 as extrinsic information for further iterations of the SOVA bit detector and iterative SOVA 356 may feed forward a new set of bit probabilities for each iteration to inner iterative decoder 374. When decode decision parameters are met, the codeword may be decoded into a set of decoded bit values for output or further processing by RLL decoder 376 and data descrambler 378.

RLL decoder 376 may decode the run length limited codes encoded by the RLL encoder 308 during the data writing process, and the data descrambler 378 may descramble the resulting sequence, which eventually can reveal the original user data written into the storage media. The recovered or read data, output data 380, may then be sent to a requesting device, such as a host computer, network node, etc., in response to receiving the request for the data.

Figure 4:
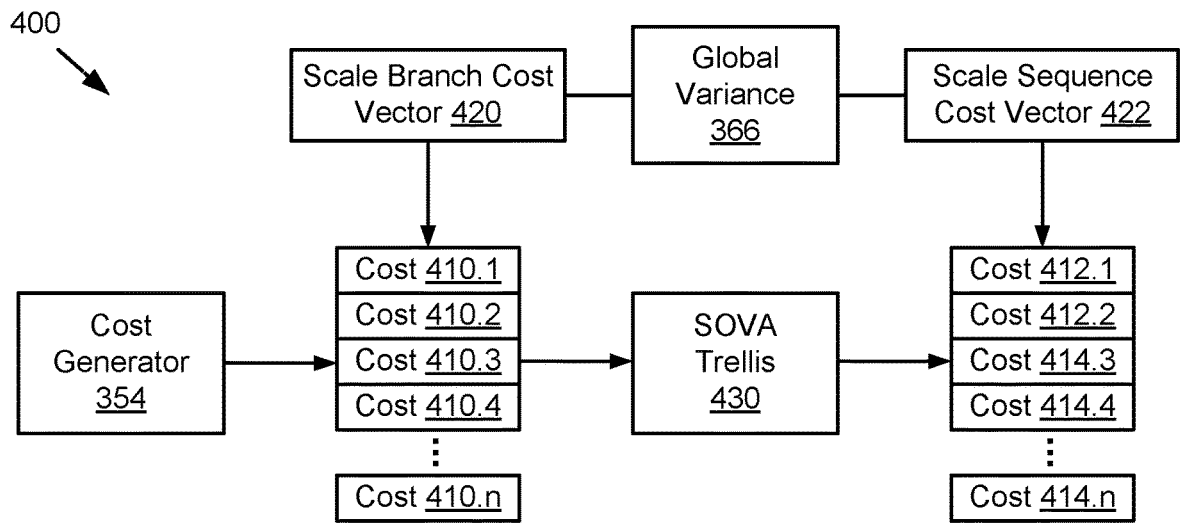
FIG. 4 is a block diagram of an example soft output detector using a global variance parameter to scale cost vectors.

As shown in FIG. 4, a portion 400 of control circuitry 300 may use global variance parameter 366 to scale the cost vectors generated by cost generator 354 before or after SOVA trellis 430 in soft output detector 352. For example, cost generator 354 may generate a branch cost vector 410 including cost values 410.1-410.n corresponding to the different branch paths through SOVA trellis 430. At block 420, global variance parameter 366 may be used to scale the variance terms of each cost value 410.1-410.n in branch cost vector 410 prior to evaluating SOVA trellis 430. In some configurations, sequence cost vector 412 may be calculated following processing by SOVA trellis 430 and include cost values 412.1-412.n for the cost of following the sequence of bits in each path or branch through SOVA trellis 430. At block 422, global variance parameter 366 may be used to scale the variance terms of each cost value 410.1-410.n in sequence cost vector after processing through SOVA trellis 430.

Figure 5:
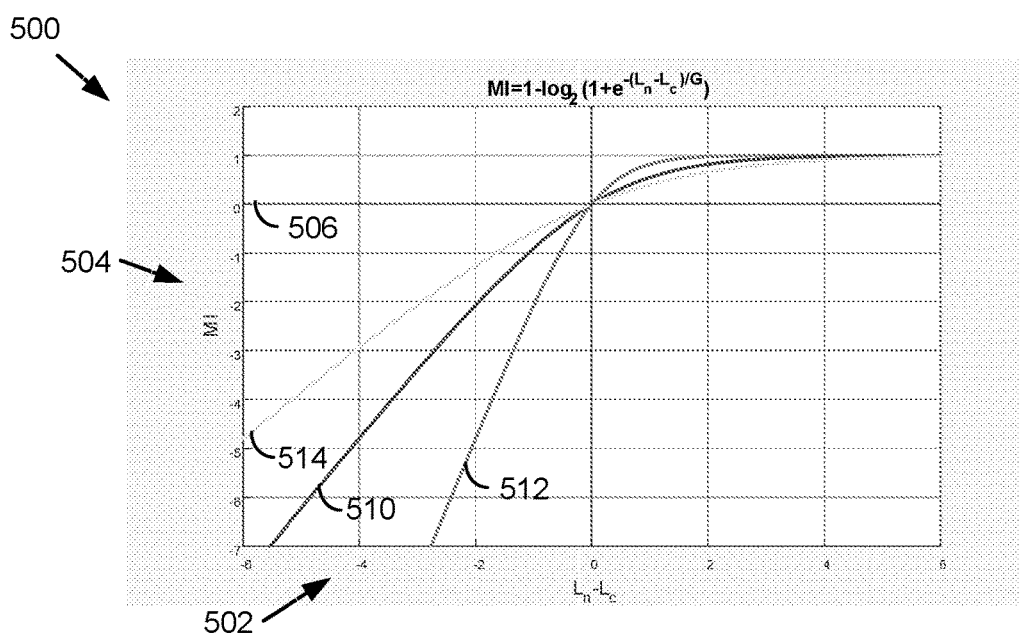
FIG. 5 is an example graph of a relationship between mutual information and cost difference at different global variances.

FIG. 5 shows an example graph 500 of the relationship between mutual information and SOVA margin for binary symbols. The x-axis 502 is SOVA margin or cost difference $L_n - L_c$ and the y-axis 504 is mutual information. Mutual information has a maximum value of 1 and 0 is the line 506 between correct symbol information and incorrect symbol information. For example, mutual information above 0-line 506 indicates no error (the bit is correct in a binary symbol) and mutual information below 0-line 506 indicates an error (the bit is incorrect in the binary symbol). Graph 500 is based on the following equation:

$$MI = 1 - \log_2\left(1 + e^{-(L_n - L_c)/G}\right)$$

and uses the same conventions described above. Each curve represents a different global variance parameter value (G). For example, curve 510 represents a global variance parameter of G=1, curve 512 represents a global variance parameter of G=0.5, and curve 514 represents a global variance parameter of G=1.5. Reducing global variance causes mutual information to change more quickly as it moves away from 0-line 506 and equal costs for correct and incorrect values. Increasing global variance flattens the change. It is relevant that all curves intersect at x=0, y=0. Global variance does not alter whether a bit is in error or not and, in principle, does not change the bit error rate. Therefore, it may not be useful to use bit error rate as a metric to optimize mutual information or to set global variance in terms of mutual information. While small BER changes are possible, particularly if global variance is applied prior to the SOVA trellis, the BER is largely irrelevant to setting global variance and remain relatively fixed when optimizing for mutual information. As curves 510, 512, and 514 show, global variance significantly changes the negative MI for symbols while only slightly changing the positive MI for symbols.

Figure 6A:
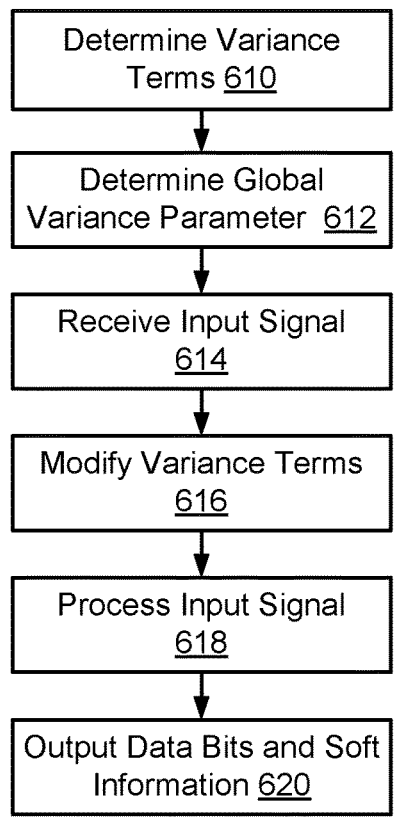
FIGS. 6A, 6B, 6C, and 6D are an example method of modifying soft output detector operation using a global variance parameter based on mutual information.
Figure 6B:
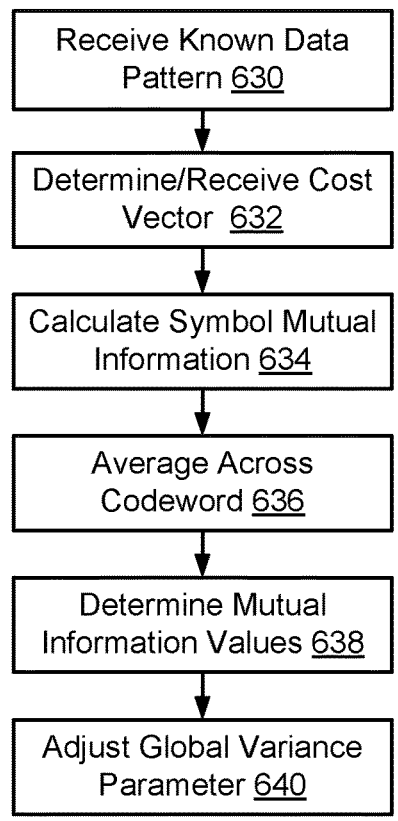
Figure 6C:
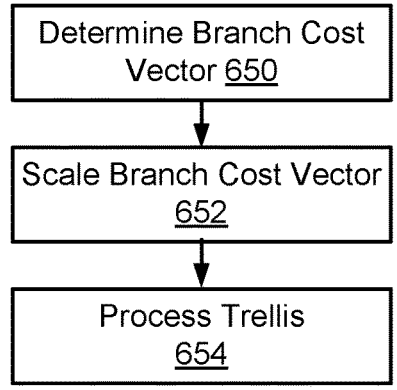
Figure 6D:
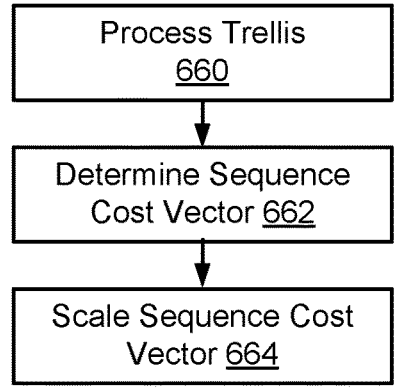

As shown in FIGS. 6A, 6B, 6C, and 6D, control circuitry 300 may be operated according to an example method of modifying soft output detector operation using a global variance parameter based on mutual information, i.e., according to the method 600 illustrated by blocks 610-664. FIG. 6A shows an example method 602 for using a global variance parameter to modify variance terms of a soft output detector at blocks 610-620. FIG. 6B shows an example method 604 of determining the global variance parameter based on mutual information at block 630-640. FIG. 6C shows an example method 606 for scaling branch cost vectors prior to processing through the SOVA trellis at blocks 650-654 and FIG. 6D shows an example method 608 for scaling sequence cost vectors after processing through the SOVA trellis at blocks 660-664.

At block 610, variance terms are determined for a soft output detector. For example, the SOVA detector may determine the branch variance terms for each branch of the SOVA trellis.

At block 612, a global variance parameter may be determined. For example, a global variance calculator may have previously calculated or otherwise set the global variance parameter value to be used for this symbol and/or iteration of the SOVA detector.

At block 614, an input signal may be received. For example, the SOVA detector may receive a digital read signal from one or more signal conditioning components for the symbol being processed.

At block 616, variance terms may be modified. For example, the SOVA detector may use the global variance term value determined at block 612 to scale the variance of each branch variance term.

At block 618, the input signal may be processed. For example, the SOVA detector may process the input signal through the SOVA trellis.

At block 620, data bits and soft information may be output by the soft output detector. For example, the SOVA detector may pass the data bits and soft information to an LDPC decoder for decoding the codeword containing the processed symbol.

At block 630, a known data pattern may be received. For example, the SOVA detector may receive a known data pattern based on known test data or from feedback of a previously detected and/or decoded symbol value.

At block 632, a cost vector may be determined or received. For example, the SOVA detector may determine the cost vector for the input data and that cost vector may be received by a mutual information calculator.

At block 634, symbol mutual information may be determined. For example, the mutual information calculator may use the cost vector for the symbol to determine the symbol mutual information.

At block 636, mutual information values may be averaged across a codeword. For example, the mutual information calculator may aggregate symbol mutual information values across the symbols in the codeword to determine an average mutual information for the codeword.

At block 638, mutual information values may be determined. For example, the codeword mutual information value from block 626 may be output by the mutual information calculator for use in adjusting the global variance parameter.

At block 640, the global variance parameter may be adjusted based on the mutual information values. For example, the mutual information values from the mutual information calculator may be used by the global variance calculator to adjust a current global variance parameter value in an attempt to move the mutual information values closer to a target mutual information value. The adjusted global variance parameter may be a next global variance parameter to be used at block 612 for future processing of method 602 by the SOVA detector.

At block 650, a branch cost vector may be determined. For example, a cost generator may process the input signal prior to the SOVA trellis to determine the branch cost vector for a symbol.

At block 652, the branch cost vector may be scaled by the global variance parameter. For example, the branch costs may each include a variance term that is modified by the global variance term as described at block 616.

At block 654, the SOVA trellis may be processed. For example, the SOVA trellis may process the input signal for the symbol at block 618 following scaling of the branch cost vector.

At block 660, the SOVA trellis may be processed. For example, the SOVA trellis may process the input signal for the symbol at block 618 and determine the most likely path through the SOVA trellis based on the branch cost vector.

At block 662, a sequence cost vector may be determined. For example, the cost generator may process the output from the SOVA trellis for the symbol to determine the sequence cost vector for the input data.

At block 664, the sequence cost vector may be scaled by the global variance parameter. For example, the sequence costs may each include a variance term that is modified by the global variance term as described at block 616.

Figure 7:
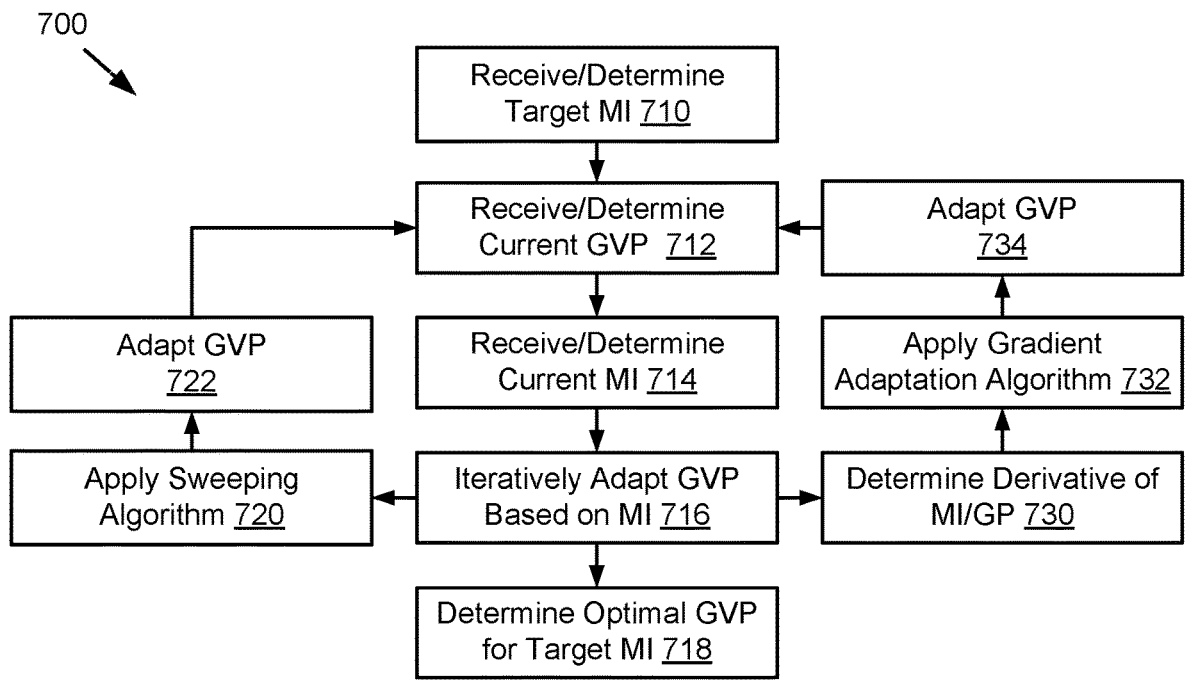
FIG. 7 is an example method of determining a global variance parameter based on mutual information.

As shown in FIG. 7, control circuitry 300 may be operated according to an example method of determining a global variance parameter based on mutual information, i.e., according to the method 700 illustrated by blocks 710-734.

At block 710, a target mutual information value may be determined or received. For example, a soft output detector may be configured with a mutual information target value in its configuration parameters.

At block 712, a current global variance parameter value may be received or determined. For example, the current global variance parameter value may be determined from a memory location for the current value or received as part of a global variance adjustment operation.

At block 714, a current mutual information value may be received or determined. For example, the most recent mutual information values for one or more codewords may be determined from a memory location or received as part of the global variance adjustment operation from a mutual information calculator.

At block 716, the global variance parameter may be iteratively adapted based on achieving the target mutual information value or threshold. For example, the global variance calculator may iteratively calculate global variance values, process (or reprocess) input values to determine changes in resulting mutual information, and iterate until the target mutual information threshold is met or exceeded. Example iteration blocks are shown at blocks 720-722 and block 730-734.

At block 718, an optimal global variance parameter may be determined for the target mutual information. For example, iteration through block 716 may continue until a global variance parameter value meets or exceeds the target mutual information. In some configurations, the resulting global variance parameter may be used for an operating period until method 700 is initiated again for calibrating or updating the global variance parameter.

At block 720, a sweeping algorithm may be applied to determining the iterative adaptation of the global variance parameter. For example, a sweeping algorithm may define a range and steps to sweep through the possible values for the global variance parameter to identify the global variance parameter within the range that maximizes mutual information.

At block 722, the global variance parameter value may be adapted for each iteration. For example, the sweeping algorithm may define a step and/or pattern (including randomization) of trying different values in the range of potential values and the adapted global variance parameter value may be used for processing input read data to update the corresponding calculation of mutual information.

At block 730, a derivative of mutual information and the global variance parameter may be determined. For example, a gradient adapter may determine the derivative based on the currently available mutual information and global variance parameters.

At block 732, a gradient adaptation algorithm may be applied. For example, the gradient adapter may apply a gradient adaptation algorithm to the derivative curve to determine a next global variance parameter value likely to maximize the mutual information.

At block 734, the global variance parameter value may be adapted for each iteration. For example, each adapted global variance parameter value determined by the gradient adaptation algorithm may be used for processing input read data to update the corresponding calculation of mutual information.

Figure 8:
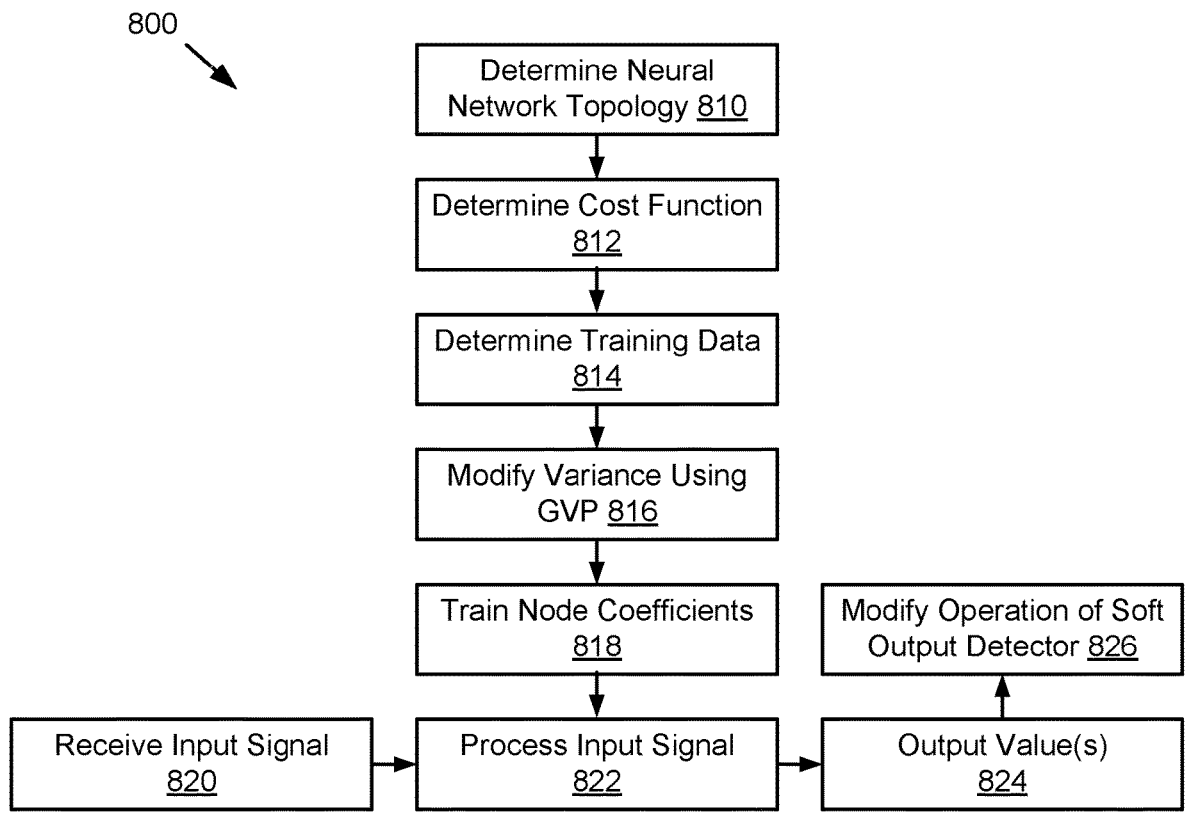
FIG. 8 is an example method of using a global variance parameter to modify operation of a neural network in the read channel.

As shown in FIG. 8, control circuitry 300 may be operated according to an example method of determining a global variance parameter based on mutual information, i.e., according to the method 800 illustrated by blocks 810-826.

At block 810, a neural network topology may be determined. For example, the read channel may be configured with one or more neural network circuits with defined neural network topologies for the signal processing function.

At block 812, a cost function may be determined. For example, the neural network circuit may have an associated cost function for training and retraining the coefficients in the neural network.

At block 814, training data may be determined. For example, the neural network circuit may be configured to use training data previously stored to the storage medium or dynamic feedback from previously processed codewords as training data for retraining node coefficients.

At block 816, a variance term may be modified using a global variance parameter. For example, the global variance parameter determined for the SOVA detector may be applied to a variance term in the cost function of the neural network circuit.

At block 818, the node coefficients may be trained. For example, the training data with corresponding known data values may be iteratively processed through the neural network circuit with the node coefficients adapting according to the cost function with the modified variance term. The resulting node coefficients may then be used for the operating neural network circuit during an operating period until a next retraining occurs.

At block 820, an input signal may be received by the neural network. For example, the neural network circuit may be positioned before the SOVA detector to assist with signal processing and receive the read data signal before the SOVA detector.

At block 822, the input signal may be processed. For example, the input signal may be processed though the neural network with the trained node coefficients from block 818.

At block 824, data and/or parameter values may be output by the neural network. For example, the neural network circuit may be configured to modify (e.g., filter) the read data signal and/or determine state information or other parameters and those parameters or modified read data may be output to a next component in the read channel, such as the SOVA detector.

At block 826, operation of the soft output detector may be modified. For example, the modified read data or other parameters provided to the SOVA detector will impact that bit determinations and/or soft information determined by the detector, which may include changing the mutual information calculations. Varying the global variance parameter for both the SOVA detector and the neural network circuits may enable the same parameter to optimize mutual information for the read channel as a whole.

Technology for improved performance of read channel circuits by using a global variance parameter based on mutual information is described. In the above description, for purposes of explanation, numerous specific details were set forth. It will be apparent, however, that the disclosed technologies can be practiced without any given subset of these specific details. In other instances, structures and devices are shown in block diagram form. For example, the disclosed technologies are described in some implementations above with reference to particular hardware.

Reference in the specification to "one embodiment" or "an embodiment" means that a particular feature, structure, or characteristic described in connection with the embodiment is included in at least one embodiment or implementation of the disclosed technologies. The appearances of the phrase "in one embodiment" in various places in the specification are not necessarily all referring to the same embodiment or implementation.

Some portions of the detailed descriptions above may be presented in terms of processes and symbolic representations of operations on data bits within a computer memory. A process can generally be considered a self-consistent sequence of operations leading to a result. The operations may involve physical manipulations of physical quantities. These quantities take the form of electrical or magnetic signals capable of being stored, transferred, combined, compared, and otherwise manipulated. These signals may be referred to as being in the form of bits, values, elements, symbols, characters, terms, numbers, or the like.

These and similar terms can be associated with the appropriate physical quantities and can be considered labels applied to these quantities. Unless specifically stated otherwise as apparent from the prior discussion, it is appreciated that throughout the description, discussions utilizing terms for example "processing" or "computing" or "calculating" or "determining" or "displaying" or the like, may refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The disclosed technologies may also relate to an apparatus for performing the operations herein. This apparatus may be specially constructed for the required purposes, or it may include a general-purpose computer selectively activated or reconfigured by a computer program stored in the computer. Such a computer program may be stored in a computer readable storage medium, for example, but is not limited to, any type of disk including floppy disks, optical disks, compact disk read-only memories (CD-ROMs), and magnetic disks, read-only memories (ROMs), random access memories (RAMs), erasable programmable read-only memories (EPROMs), electrically erasable programmable read-only memories (EEPROMs), magnetic or optical cards, flash memories including universal serial bus (USB) keys with non-volatile memory or any type of media suitable for storing electronic instructions, each coupled to a computer system bus.

The disclosed technologies can take the form of an entire hardware implementation, an entire software implementation or an implementation containing both hardware and software elements. In some implementations, the technology is implemented in software, which includes but is not limited to firmware, resident software, microcode, etc.

Furthermore, the disclosed technologies can take the form of a computer program product accessible from a non-transitory computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

A computing system or data processing system suitable for storing and/or executing program code will include at least one processor (e.g., a hardware processor) coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modems, and Ethernet cards are just a few of the currently available types of network adapters.

The terms storage media, storage device, and data blocks are used interchangeably throughout the present disclosure to refer to the physical media upon which the data is stored.

Finally, the processes and displays presented herein may not be inherently related to any particular computer or other apparatus. Various general-purpose systems may be used with programs in accordance with the teachings herein, or it may prove convenient to construct more specialized apparatus to perform the required method operations. The required structure for a variety of these systems will appear from the description above. In addition, the disclosed technologies were not described with reference to any particular programming language. It will be appreciated that a variety of programming languages may be used to implement the teachings of the technologies as described herein.

The foregoing description of the implementations of the present techniques and technologies has been presented for the purposes of illustration and description. It is not intended to be exhaustive or to limit the present techniques and technologies to the precise form disclosed. Many modifications and variations are possible in light of the above teaching. It is intended that the scope of the present techniques and technologies be limited not by this detailed description. The present techniques and technologies may be implemented in other specific forms without departing from the spirit or essential characteristics thereof. Likewise, the particular naming and division of the modules, routines, features, attributes, methodologies and other aspects are not mandatory or significant, and the mechanisms that implement the present techniques and technologies or its features may have different names, divisions and/or formats. Furthermore, the modules, routines, features, attributes, methodologies and other aspects of the present technology can be implemented as software, hardware, firmware or any combination of the three. Also, wherever a component, an example of which is a module, is implemented as software, the component can be implemented as a standalone program, as part of a larger program, as a plurality of separate programs, as a statically or dynamically linked library, as a kernel loadable module, as a device driver, and/or in every and any other way known now or in the future in computer programming. Additionally, the present techniques and technologies are in no way limited to implementation in any specific programming language, or for any specific operating system or environment. Accordingly, the disclosure of the present techniques and technologies is intended to be illustrative, but not limiting.

What is claimed is:

1. A read channel circuit, comprising:
 a soft output detector circuit comprising a plurality of variance terms for determining data bits from an input signal and configured to:
  receive the input signal;
  modify the plurality of variance terms using a global variance parameter to scale the plurality of variance terms;
  process, using the modified plurality of variance terms, the input signal through a trellis of state probabilities to determine the data bits and corresponding soft information; and
  output, to a parity-based decoder circuit, the data bits and corresponding soft information for decoding encoded data from the input signal.

2. The read channel circuit of claim 1, wherein the global variance parameter is configured to scale a cost vector comprising a cost value for each branch of the trellis of the soft output detector circuit for pattern-dependent noise prediction.

3. The read channel circuit of claim 2, wherein the soft output detector circuit is further configured to scale the cost vector for branch costs using the global variance parameter prior to processing the input signal through the trellis.

4. The read channel circuit of claim 2, wherein the soft output detector circuit is further configured to scale the cost vector for sequence costs responsive to processing the input signal through the trellis.

5. The read channel circuit of claim 1, further comprising:
 a neural network circuit configured to:
  process the input signal prior to the trellis of the soft output detector circuit; and
  output at least one value to modify operation of the trellis of the soft output detector circuit, wherein the neural network circuit comprises a variance term modified using the global variance parameter.

6. The read channel circuit of claim 1, further comprising:
a global variance calculator circuit configured to determine the global variance parameter based on mutual information values.

7. The read channel circuit of claim 6, further comprising:
a mutual information calculator circuit configured to:
receive a known data pattern for at least one data symbol in the input signal;
receive a corresponding cost vector from a cost generator circuit for the soft output detector circuit for the known data pattern;
calculate a symbol mutual information value based on the known data pattern and corresponding cost vector; and
average symbol mutual information values for a plurality of data symbols in the input signal across a codeword to determine the mutual information values.

8. The read channel circuit of claim 7, further comprising:
a gradient adapter circuit configured to:
receive a target mutual information value;
receive a current global variance parameter;
receive current mutual information values based on the current global variance parameter; and
iteratively adapt the global variance parameter to move the mutual information values closer to the target mutual information value.

9. The read channel circuit of claim 8, wherein:
iteratively adapting the global variance parameter is based on at least one of:
a sweeping algorithm for the global variance parameter; or
a gradient adaptation algorithm based on a derivative of mutual information values to global variance parameters; and
iteratively adapting the global variance parameter is not responsive to calculating bit error rate.

10. A data storage device comprising the read channel circuit of claim 1.

11. A method comprising:
receiving, by a soft output detector, an input signal;
modifying, using a global variance parameter, a plurality of variance terms in a soft output detector to scale the plurality of variance terms;
processing, by the soft output detector and using the modified plurality of variance terms, the input signal through a trellis of state probabilities to determine data bits and corresponding soft information; and
outputting, by the soft output detector and to a parity-based decoder circuit, the data bits and corresponding soft information for decoding encoded data from the input signal.

12. The method of claim 11, wherein modifying the plurality of variance terms comprises:
scaling, using the global variance parameter, a cost vector comprising a cost value for each branch of the trellis of the soft output detector for pattern-dependent noise prediction.

13. The method of claim 12, wherein scaling the cost vector is executed for branch costs prior to processing the input signal through the trellis.

14. The method of claim 12, wherein scaling the cost vector is executed for sequence costs responsive to processing the input signal through the trellis.

15. The method of claim 11, further comprising:
processing, by a neural network, the input signal prior to the trellis of the soft output detector; and
outputting, by the neural network, at least one value to modify operation of the trellis of the soft output detector, wherein the neural network comprises a variance term modified using the global variance parameter.

16. The method of claim 11, further comprising:
determining the global variance parameter based on mutual information values.

17. The method of claim 16, further comprising:
receiving a known data pattern for at least one data symbol in the input signal;
receiving a corresponding cost vector from a cost generator for the soft output detector for the known data pattern;
calculating a symbol mutual information value based on the known data pattern and corresponding cost vector; and
averaging symbol mutual information values for a plurality of data symbols in the input signal across a codeword to determine the mutual information values.

18. The method of claim 17, further comprising:
determine a target mutual information value;
receiving a current global variance parameter;
receiving current mutual information values based on the current global variance parameter; and
iteratively adapting the global variance parameter to move the mutual information values closer to the target mutual information value.

19. The method of claim 18, wherein
iteratively adapting the global variance parameter is based on at least one of:
a sweeping algorithm for the global variance parameter; or
a gradient adaptation algorithm based on a derivative of mutual information values to global variance parameters; and
iteratively adapting the global variance parameter is not responsive to calculating bit error rate.

20. A system comprising:
means, comprising a plurality of branch variance terms for determining data bits from an input signal, for:
receiving the input signal;
modifying a plurality of variance terms using a global variance parameter to scale the plurality of variance terms, wherein the global variance parameter is based on mutual information values;
processing, using the modified plurality of variance terms, the input signal through a trellis of state probabilities to determine the data bits and corresponding soft information; and
outputting, to a parity-based decoder circuit, the data bits and corresponding soft information for decoding encoded data from the input signal; and
means for:
receiving a known data pattern for at least one data symbol in the input signal;
receiving a corresponding cost vector from a cost generator circuit for the known data pattern;
calculating a symbol mutual information value based on the known data pattern and corresponding cost vector; and
averaging symbol mutual information values for a plurality of data symbols in the input signal across a codeword to determine the mutual information values.

* * * * *